(12) United States Patent
Zhu et al.

(10) Patent No.: US 9,024,418 B2
(45) Date of Patent: May 5, 2015

(54) LOCAL INTERCONNECT STRUCTURES FOR HIGH DENSITY

(71) Applicant: QUALCOMM Incorporated, San Diego, CA (US)

(72) Inventors: John Jianhong Zhu, San Diego, CA (US); Giridhar Nallapati, San Diego, CA (US); PR Chidambaram, San Diego, CA (US)

(73) Assignee: QUALCOMM Incorporated, San Diego, CA (US)

( * ) Notice: Subject to any disclaimer, the term of this patent is extended or adjusted under 35 U.S.C. 154(b) by 0 days.

(21) Appl. No.: 13/829,864

(22) Filed: Mar. 14, 2013

(65) Prior Publication Data

US 2014/0264629 A1   Sep. 18, 2014

(51) Int. Cl.
*H01L 27/02* (2006.01)
*H01L 23/528* (2006.01)
*H01L 21/768* (2006.01)
*H01L 21/8234* (2006.01)
*H01L 27/088* (2006.01)

(52) U.S. Cl.
CPC ........ *H01L 23/528* (2013.01); *H01L 21/76841* (2013.01); *H01L 21/76895* (2013.01); *H01L 21/823475* (2013.01); *H01L 21/823481* (2013.01); *H01L 27/0207* (2013.01); *H01L 27/088* (2013.01)

(58) Field of Classification Search
CPC . H01L 27/092; H01L 27/088; H01L 27/1104; H01L 21/743; H01L 21/76816; H01L 21/823821; H01L 27/0688; H01L 27/76885; H01L 21/76895; H01L 24/32
USPC ......................................... 257/758

See application file for complete search history.

(56) References Cited

U.S. PATENT DOCUMENTS

| | | |
|---|---|---|
| 5,360,757 A | 11/1994 | Lage |
| 7,681,164 B2 | 3/2010 | Lin et al. |
| 7,920,403 B2 * | 4/2011 | Liaw ........................ 365/104 |
| 8,120,939 B2 | 2/2012 | Liaw |
| 8,138,554 B2 | 3/2012 | Chuang et al. |
| 2006/0040460 A1 | 2/2006 | Kakimura et al. |
| 2010/0059825 A1 | 3/2010 | Yeric et al. |
| 2010/0117120 A1 | 5/2010 | Yamashita |
| 2011/0241126 A1 | 10/2011 | Herberholz |
| 2012/0211837 A1 | 8/2012 | Baars et al. |
| 2013/0020707 A1 | 1/2013 | Or-Bacj et al. |
| 2013/0170275 A1 * | 7/2013 | Kumar et al. ................. 365/63 |
| 2013/0207199 A1 | 8/2013 | Becker et al. |
| 2013/0242633 A1 | 9/2013 | Liaw |

FOREIGN PATENT DOCUMENTS

| | | |
|---|---|---|
| EP | 0788166 A2 | 8/1997 |
| EP | 2341537 A2 | 7/2011 |

OTHER PUBLICATIONS

International Search Report and Written Opinion—PCT/US2014/023657—ISA/EPO—Aug. 18, 2014.

* cited by examiner

*Primary Examiner* — Roy Potter
*Assistant Examiner* — Paul Patton
(74) *Attorney, Agent, or Firm* — Haynes and Boone, LLP

(57) ABSTRACT

A local interconnect structure is provided that includes a gate-directed local interconnect coupled to an adjacent gate layer through a diffusion-directed local interconnect.

20 Claims, 8 Drawing Sheets

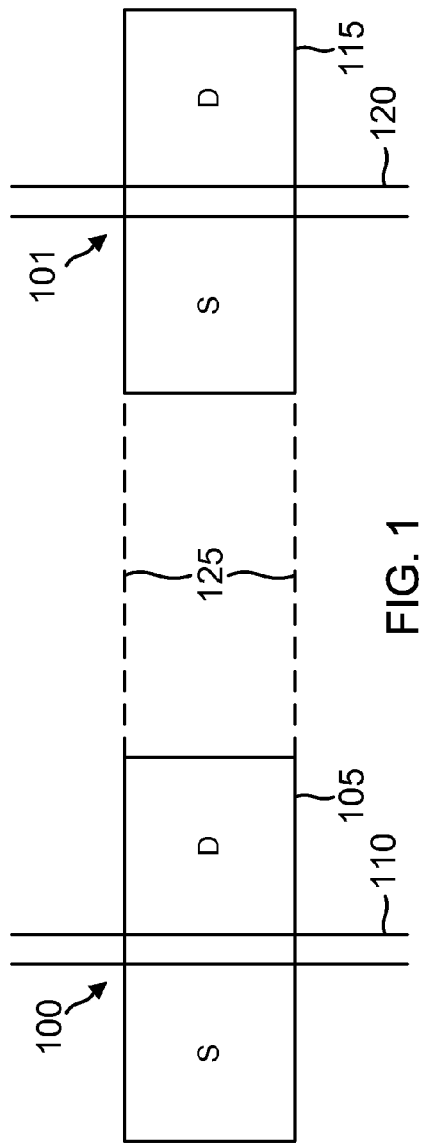
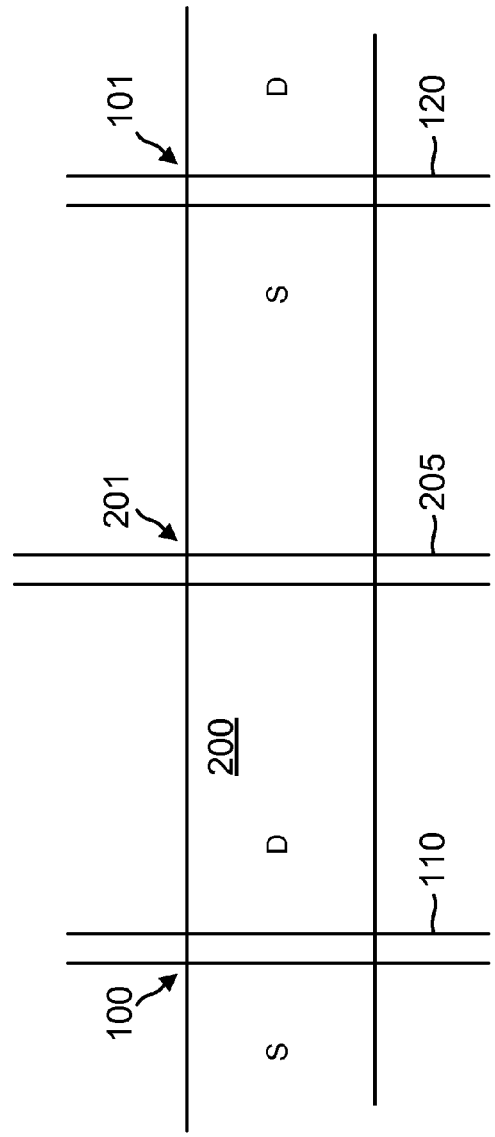

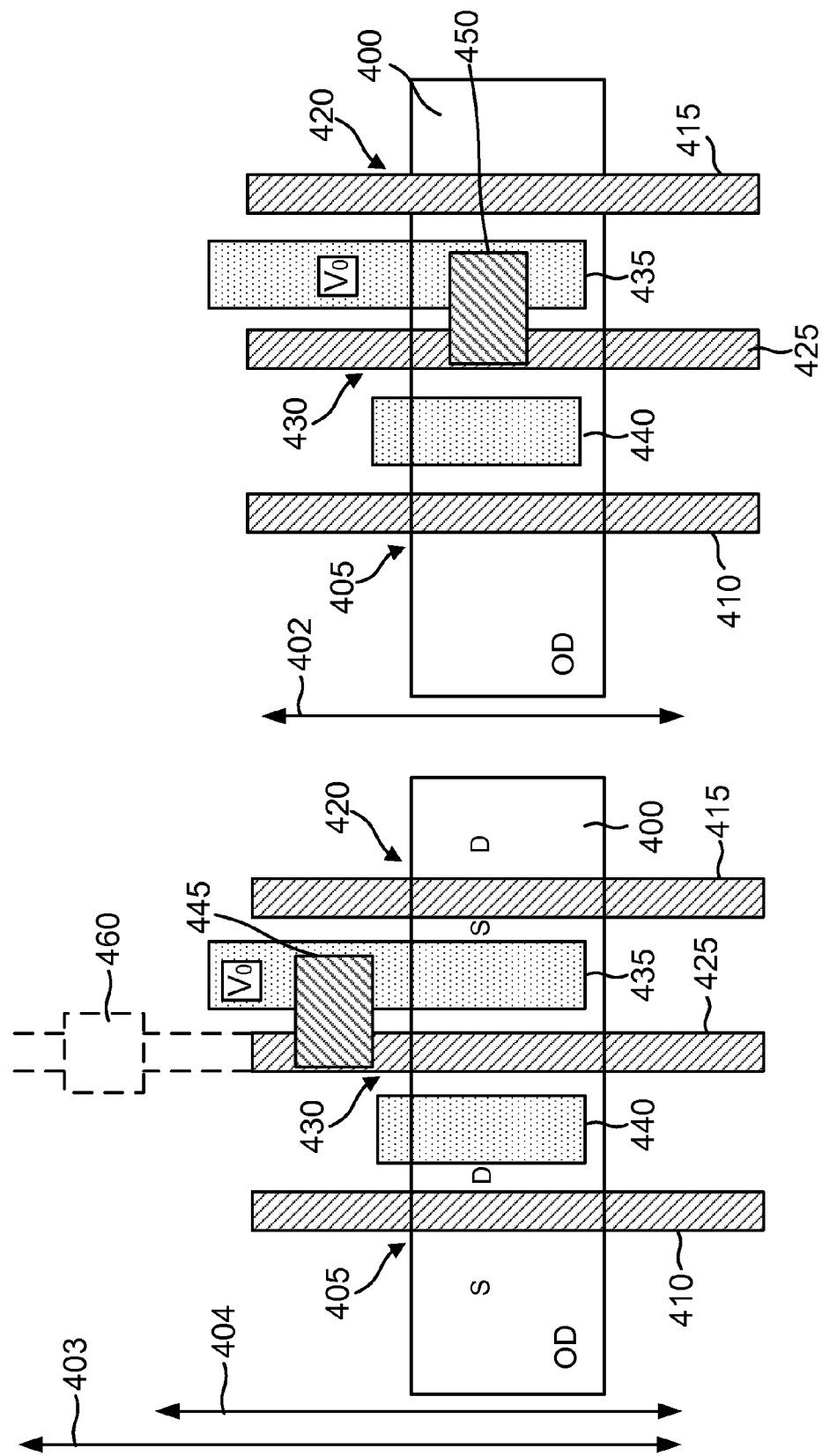

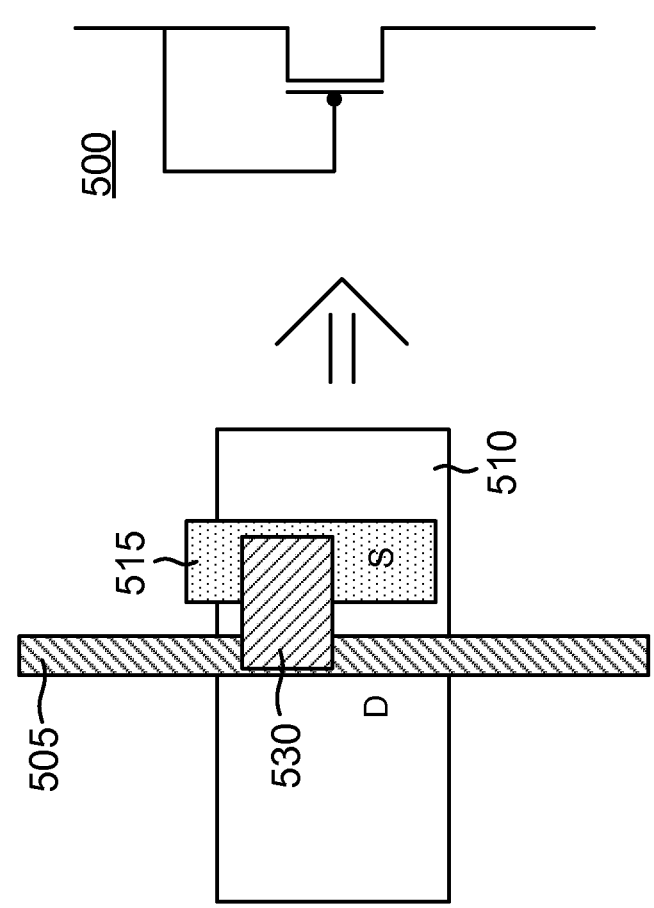
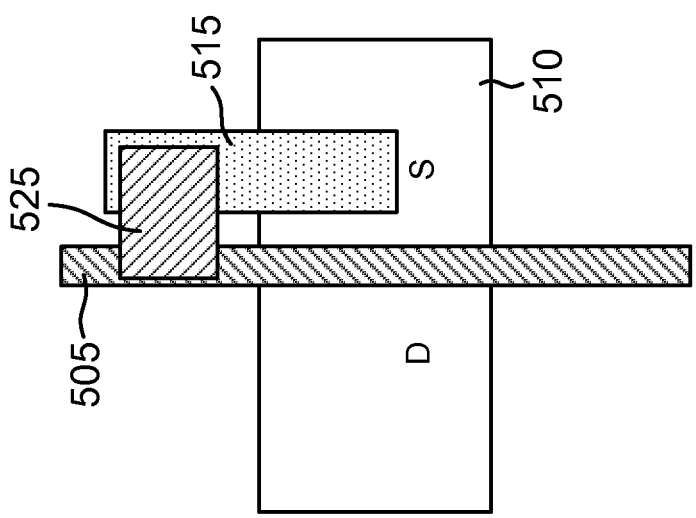
FIG. 5A  FIG. 5B  FIG. 5C

LOCAL INTERCONNECT STRUCTURES FOR HIGH DENSITY

TECHNICAL FIELD

This application relates to an improved high-density circuit architecture, and more particularly to a high-density local interconnect structure.

BACKGROUND

As semiconductor technology advances into the deep sub-micron process nodes, short channel effects can severely degrade performance. The carrier velocity saturates in such short channels, which slows switching speeds and reduces transistor strength. To achieve high density yet have adequate transistor strength, strain engineering techniques have been developed so that the crystal lattice for the semiconductor substrate is strained in the diffusion region used to form the transistor source and drains. The diffusion region is typically referred to as oxide diffusion or "OD" with regard to transistor layout terminology. In other words, the OD is not only doped n-type or p-type as appropriate to achieve the desired transistor type (NMOS or PMOS) but is also strained to increase carrier velocity and transistor strength.

A local strain for just the diffusion regions has proven to be superior as compared to the use of a global strain across the entire substrate. The type of local strain depends upon the transistor type. The diffusion region for a PMOS transistor is compressively strained whereas the diffusion region for an NMOS transistor has tensile strain. For example, a film of SiGe may be applied to a p-type diffusion region to introduce compressive strain whereas a film of SiN may be applied to an n-type diffusion region to introduced tensile strain. The resulting strain engineering of silicon has proven to be quite successful for the achievement of satisfactory transistor strength in deep sub-micron process nodes.

Strain engineering on the diffusion regions introduces a number of constraints into the layout process. FIG. 1 illustrates the layout for an example pair of transistors. A first transistor 100 has its source (S) and drain (D) defined by a first diffusion region 105. A polysilicon gate 110 separates the source and drain regions. Diffusion region 105 spans underneath polysilicon gate 110 between the source and drain regions to form a channel for first transistor 100. A similar arrangement of another diffusion region 115 and polysilicon gate 120 defines a second transistor 101. At advanced process nodes, the layout of FIG. 1 would be inefficient because the diffusion regions 105 and 115 are relatively short. Such a short length for a diffusion region allows its crystal lattice to relax too much despite the use of local strain engineering. Transistors 100 and 101 would thus be too weak. In contrast, if diffusion regions 105 and 115 could be extended as shown by the dotted lines 125 to form a continuous diffusion region, there would be increased local strain and thus better performance. But such an extension for diffusion regions 105 and 115 would short the drain of first transistor 100 to the source of second transistor 101.

To achieve satisfactory transistor performance in the deep sub-micron process nodes, "continuous OD" layouts have been developed. FIG. 2 illustrates an example continuous diffusion region layout for a diffusion region 200. Transistors 100 and 101 are still defined with respect to polysilicon gates 110 and 120, respectively. But diffusion region 200 is continuous for both transistors such that it can develop adequate lattice strain for satisfactory transistor strength. A blocking transistor 201 defined with regard to a polysilicon gate 205 electrically isolates transistors 100 and 101 by being configured to be always turned off For example, if diffusion 200 is doped p-type, blocking transistor 201 is a PMOS transistor such that polysilicon gate 205 would be tied to the power supply voltage VDD to isolate transistors 100 and 101 from each other. Alternatively, if diffusion region 200 is doped n-type, blocking transistor 201 is an NMOS transistor such that polysilicon gate 205 would be tied to ground to isolate transistors 100 and 101.

Although the use of continuous OD enables sufficient crystal lattice strain to be achieved, the charging of the gates for the blocking transistors complicates the layout. To perform this charging, local interconnects are used to couple from power (or ground) metal layers to the gate layers for the blocking transistors. The layout of the local interconnects for the blocking transistors has proven to be awkward and decreases density.

Accordingly, there is a need in the art for improved local interconnect layouts.

SUMMARY

Deep sub-micron technology has led to the development of multi-level local interconnects that are arranged between a first metal layer for an integrated circuit and the integrated circuit's underlying semiconductor substrate. The separation between the semiconductor substrate and the first metal layer may be considered to be sub-divided into three levels. A first level is closest to the semiconductor substrate whereas a third level is closest to the first metal layer. A second level lies between the first and second levels. First-level local interconnects and the gate layers are arranged within the first level. As known in the semiconductor arts, the gates layers are arranged according to a gate-layer pitch such that the gate layers all extend in a gate-directed direction. The first level local interconnects are thus first level gate-directed local interconnects such that the gate-directed first level local interconnects also are all arranged to extend in the gate-directed direction. In contrast to the gate layers, a continuous diffusion region in the semiconductor substrate is arranged to extend in a diffusion-directed direction that is generally orthogonal to the gate-directed direction.

The second level comprises level 2 interconnects that form two types: level 2 gate-directed local interconnects and level 2 diffusion-directed local interconnects. The level 2 gate-directed local interconnects all extend in the gate-directed direction. In contrast, the level 2 diffusion-directed local interconnects may extend in the diffusion-directed direction. Alternatively, the level 2 diffusion directed local interconnects may have a square footprint such that they are neither gate-directed nor diffusion-directed. The third level comprises vias that couple between the first metal layer (or higher metal layers) and the structures in the underlying levels.

The following discussion concerns an advantageous arrangement of level 2 local interconnects. Thus, as used herein "local interconnect" (without any level 1 or level 2 qualifier) will be understood to refer to a level 2 local interconnect. In other words, a level 2 local interconnect may be denoted as just a "local interconnect" for purposes of brevity. In the advantageous arrangement disclosed herein, a pair of gate-directed local interconnects are arranged on either side of a gate layer. A diffusion-directed local interconnect couples between one of the gate-directed local interconnects and the gate layer. As will be explained further below, such a coupling enables reduced cell height for a variety of devices such as transistors.

BRIEF DESCRIPTION OF THE DRAWINGS

FIG. 1 illustrates the layout for a pair of transistors having non-continuous diffusion regions.

FIG. 2 illustrates the layout for a pair of transistors in a continuous diffusion region.

FIG. 4A illustrates the layout for a pair of transistors in a continuous diffusion region including a blocking transistor, wherein a gate-directed local interconnect couples to the gate layer for the blocking transistor through a diffusion-directed local interconnect that does not overlap with the diffusion region.

FIG. 4B illustrates the layout for a pair of transistors in a continuous diffusion region including a blocking transistor, wherein a gate-directed local interconnect couples to the gate layer for the blocking transistor through a diffusion-directed local interconnect that overlaps with the diffusion region.

FIG. 5A illustrates a layout for a diode-connected transistor in which a diffusion-directed local interconnect couples between a gate-directed local interconnect and a gate-layer for the diode-connected local transistor without overlapping a continuous diffusion region for the diode-connected transistor.

FIG. 5B illustrates a layout for a diode-connected transistor in which a diffusion-directed local interconnect couples between a gate-directed local interconnect and a gate-layer for the diode-connected local transistor, wherein the diffusion-directed local interconnect overlaps a continuous diffusion region for the diode-connected transistor.

FIG. 5C is a schematic representation of the diode-connected transistors of FIGS. 5A and 5C.

DETAILED DESCRIPTION

A variety of local interconnect layouts or structures are disclosed for coupling between gate and non-gate regions. These structures are disclosed with regard to a two-layer local interconnect topology. Although leads in the metal layers are also sometimes denoted as "local interconnects," such leads are excluded from the definition of "local interconnect" as used herein. In older process nodes, interconnects in the first metal layer (and higher metal layers) would couple to the transistor gates and drain/source terminals through vias. But as semiconductor processing technology advanced into the deep sub-micron region, the vias from the first metal layer (or higher layers) couple to these transistor structures through a two-layer local interconnect. The vias are thus in an upper third layer (level 3) between the two lower layers of local interconnect (levels 1 and 2).

Figure 3:
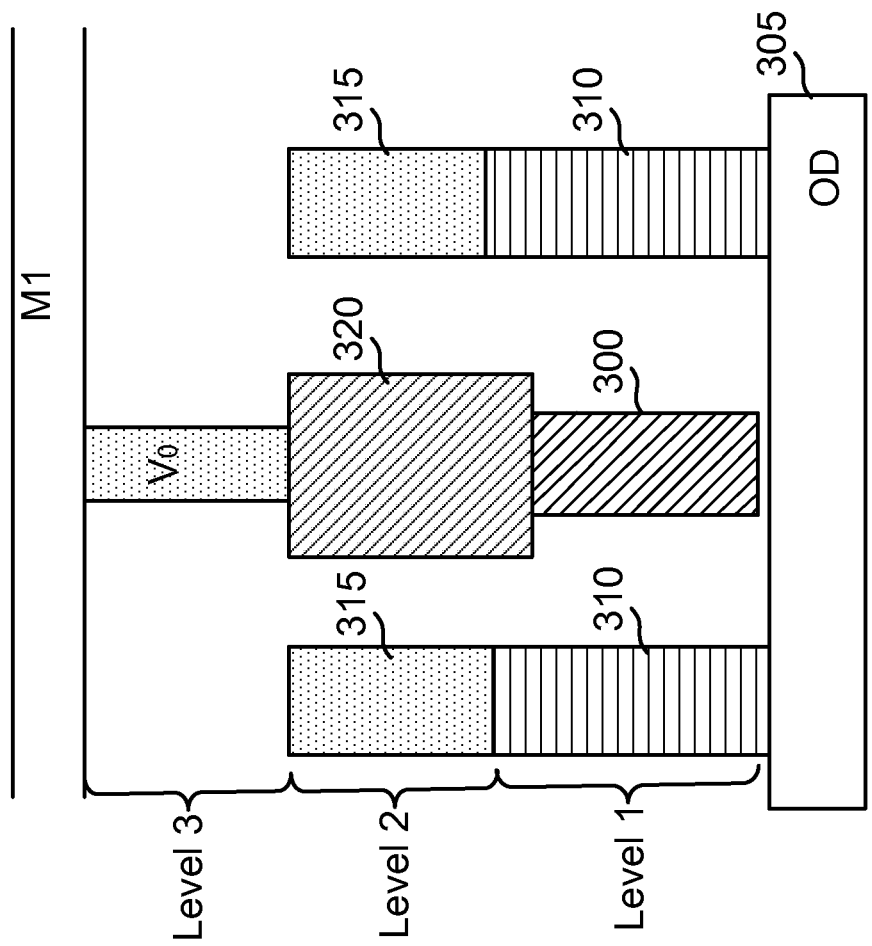
FIG. 3 is a cross-sectional view of multi-level local interconnects and associated structures.

Some example two-level local interconnects are show in FIG. 3. A level 1 local interconnect 310 comprises a local interconnect (LI) type denoted as LIc. A second level of local interconnects includes two types of local interconnect: LIa 315 and LIb 320. There is thus one type (type LIc) in level 1 whereas there are two types (types LIb and LIa) in level 2. A level 1 interconnect such as LIc 310 directly couples to a continuous diffusion region 305. Such a level 1 interconnect would thus be applied through an appropriate semiconductor processing mask to continuous diffusion region 305 prior to the formation of any level 2 interconnects. Level 1 is also the level for a gate layer 300 such as a polysilicon layer or a high-K metal layer. Gate layer 300 is not a form of local interconnect as it forms a gate for a transistor having a source, drain, and channel in continuous diffusion region 305. Level 2 interconnects such as LIa 315 and LIb 320 couple to first metal layer M1 (or higher metal layers) through vias such as a via V0. The vias are arranged in a level 3 between level 2 and the first metal layer M1.

Referring back to FIG. 2, the footprints for gate layers 110, 120, and 205 form relatively narrow polygons having a longitudinal axis that is orthogonal to a longitudinal axis for the polygonal footprint for continuous diffusion region 200. The local interconnects follow such an organization: a given type of local interconnect will generally be arranged so as to be parallel to either the gate layer or the continuous diffusion region (i.e., have a polygonal footprint with a longitudinal axis that is parallel to a longitudinal axis for the polygonal footprint for either the gate layer or the continuous diffusion region). Since it is cumbersome to repeatedly refer to the longitudinal axis of a polygonal shape used for layout purposes, a local interconnect is defined herein to be a "gate-directed local interconnect" if its polygonal footprint has a longitudinal axis parallel to the longitudinal axes for the polygonal footprints of the gate layers. Conversely, a local interconnect is defined herein to be a "diffusion-directed local interconnect" if its polygonal footprint has a longitudinal axis that is parallel to the longitudinal axes of the polygonal footprints of the diffusion regions.

A level 1 local interconnect such as LIc 310 is formed on diffusion region 305. LIc 310 thus acts as the direct electrical coupling to diffusion region 305 with regard to higher layers of interconnects. One can thus immediately appreciate that a level 1 interconnect must be a gate-directed local interconnect as otherwise it would interfere with the layout for the gate layer 300: LIc 310 cannot be a diffusion-directed local interconnect or it would short to and intersect gate layer 300. In contrast, level 2 local interconnects can be either gate-directed local interconnects or diffusion-directed local interconnects. One level 2 type of local interconnect is necessary for coupling to LIc 310 such as LIa 315. Thus, LIa 315 is a gate-directed local interconnect and couples between a corresponding via (not illustrated) in level 3 to M1 (or higher metal layers). Level 2 LIb 320 couples to gate layer 300 and is arranged to be either square (neither gate-directed nor diffusion-directed) or to be diffusion-directed. A via V0 coupling between Level 2 LIb 320 and an interconnect in metal layer M1 is representative of the level 3 interconnects between M1 and the level 1 and level 2 local interconnects. First metal layer M1 lies above level 3. LIa 315, LIb 320, and LIc 310 typically comprise tungsten whereas via V0 and M1 typically comprises copper. Other materials may be used as known in the local interconnect arts.

Overview

A local interconnect structure is provided that enhances density. For example, it is known that the gate layers are laid out according to a regular pitch. With regard to the layout or arrangement of gate layers in a constant pitch to form corresponding transistors in conjunction with a continuous diffusion region, it would be advantageously dense if every other gate layer was the gate for a blocking or isolating transistor. For example, as discussed with regard to FIG. 2, a blocking transistor 201 electrically isolates adjacent transistors 100 and 101 despite their formation on a continuous diffusion region 200. As used herein, transistors such as transistors 100 and 101 are referred to only as "transistors" to distinguish them from the corresponding blocking transistors. Continuous diffusion region 200 may be extended to allow for the formation of additional transistors. But one could not simply repeat the layout shown in FIG. 2. For example, suppose another pair of transistors isolated by a blocking transistor were located to the right of transistor 101. There would need to be another blocking transistor isolating a first transistor in this extra pair of transistors from transistor 101. So one can appreciate that there are virtually as many blocking transistors as transistors in a series of transistors formed on a single continuous diffusion region. To achieve such a relatively dense collection of transistors on a continuous diffusion region, a gate-directed local interconnect (e.g., LIa 315 of FIG. 3) would need to be on either side of a given blocking transistor's gate layer. Otherwise, there would be no electrical coupling to the source of transistor 101 or to the drain of transistor 100. But as will be explained further herein, prior art local interconnect topologies are not as area-efficient as the topologies disclosed herein.

For example, suppose continuous diffusion region 200 is doped p-type such that transistors 100, 101, and blocking transistor 201 are PMOS transistors. If a gate-directed local interconnect was tied to a power supply voltage VDD to power the source for transistor 101, it would be efficient to have a diffusion-directed local interconnect (not illustrated) couple between such a gate-directed local interconnect and gate layer 205. But under conventional design rules, there cannot be a gate-directed local interconnect on either side of gate layer 205 if one of these gate-directed local interconnect couples to gate layer 205 through a diffusion-directed local interconnect. Moreover, conventional design rules did not allow a diffusion-directed local interconnect to overlap continuous diffusion region 200. Conventional local interconnect topologies thus prevent a dense local interconnect coupling for blocking transistor 205.

A new layout topology disclosed herein provides an advantageously dense local interconnect coupling for blocking transistors such as blocking transistor 205. But the concepts and principles for the disclosed local interconnect structures are also widely applicable to other types of local-interconnect couplings as discussed further herein. In this topology, a gate layer is arranged (e.g., horizontally) between adjacent gate layers and separated from these adjacent gate layers according to a gate layer pitch. A gate-directed local interconnect is included between each one of the adjacent gate layers and the gate layer. The gate layer thus has a gate-directed local interconnect to either side of the gate layer. A diffusion-directed local interconnect couples between one of the gate-directed local interconnects and the gate layer. The diffusion-directed local interconnect thus serves as a means for coupling one of the gate-directed local interconnects to the gate layer.

Example Embodiments

The following local interconnect structures advantageously enable greater density for continuous diffusion region layouts (continuous OD). This enhanced density is achieved through an arrangement of gate-directed and diffusion-directed local interconnects. As noted earlier, the term "local interconnect" used herein without further qualifiers is a shorthand for a "level 2 local interconnect."

An example layout for a first transistor 405 and a second transistor 420 formed in a continuous diffusion region 400 is shown in FIG. 4A. As used herein, a figure illustrating a "layout" is a plan view of the footprints for the various components as they are laid out with regard to an underlying semiconductor substrate. Because of their continuity on continuous diffusion region 400, transistors 405 and 420 are electrically isolated by a blocking transistor 430 as discussed analogously with regard to blocking transistor 201 of FIG. 2. A gate layer 410, a gate layer 425, and a gate layer 415 form the gates for transistor 405, blocking transistor 430, and transistor 420, respectively. A gate-directed local interconnect 440 couples (through a corresponding level 1 gate-directed interconnect, which is not illustrated) to a drain (D) for transistor 405. Similarly, a gate-directed local interconnect 435 couples to a source for transistor 420. A via V0 coupled to gate-directed local interconnect 435 provides the appropriate source voltage for transistor 420. For example, if continuous diffusion region is doped n-type, the appropriate source voltage would be ground since transistor 405, blocking transistor 430, and transistor 420 would then be NMOS transistors. Alternatively, if continuous diffusion region were doped p-type, the appropriate source voltage would be VDD since these devices would all be PMOS transistors.

The same bias applied to gate-directed local interconnect 435 is thus also the appropriate bias for gate layer 425. For example, suppose that transistor 420 is a PMOS transistor such that gate-directed local interconnect 435 is biased to the power supply voltage VDD through via V0 to an appropriate lead in a first metal layer (not illustrated) or higher-level metal layers. A diffusion-directed local interconnect 445 thus couples between gate layer 425 and gate-directed local interconnect 435 to provide the bias to gate layer 425 to turn blocking transistor 430 fully off. This is quite advantageous as no via is then necessary for a coupling to gate layer 425 to provide its bias. Moreover, diffusion-directed local interconnect 445 does not cross over gate layer 430 towards transistor 405. In other words, diffusion-directed local interconnect 445 does not extend past gate layer 425 towards gate-directed local interconnect 440. Thus, gate-directed local interconnect 440 may provide the necessary coupling to the drain terminal of transistor 405 despite the presence of diffusion-directed local interconnect 445. In contrast, prior art layouts would not allow the formation of gate-directed local interconnect 440 since it would be on the other side of gate layer 425 with respect to its coupling through diffusion-directed local interconnect 445 to gate-directed local interconnect 435. But the blocking transistor's gate must be biased properly in a prior art layout for it to function. Thus, it was conventional to use a square-shaped local interconnect such as shown by dotted line 460 on an extension of gate layer 425. A via would then couple to such a square-shaped local interconnect to provide the bias to gate layer 425 in a prior art design. Such a prior art coupling is problematic because gate-directed local interconnect 435 must also be biased by via V0. Vias require a certain separation between them (depending upon a given semiconductor foundry's process rules). Thus, the square-shaped local interconnect 460 of the prior art had to be displaced vertically from via V0 to accommodate the via pitch. In sharp contrast, diffusion-directed local interconnect 445 eliminates the need for such a vertically-displaced coupling to gate layer 425. Thus, the layout of FIG. 4A has an advantageously reduced cell height 404 for transistors 405 and 420 as compared to conventional cell height 403, which enhances density.

Although the layout of FIG. 4A increases density as compared to prior art approaches, a footprint for diffusion-directed local interconnect 445 does not overlap with the footprint for continuous diffusion region 400. A further enhancement of density is shown in FIG. 4B. In this layout embodiment, a diffusion-directed local interconnect 450 couples between gate-directed local interconnect 435 and gate layer 425 analogous to the coupling provided by diffusion-directed local interconnect 445 of FIG. 4A. However, the footprint for diffusion-directed local interconnect 450 is placed within the footprint of continuous diffusion region 400. The remaining components shown in FIG. 4B are as described with regard to FIG. 4A. Such an overlap of diffusion-directed local interconnect 450 is advantageous because a cell 402 height for transistors 405 and 420 is reduced as compared to cell height 404 achieved through the use of diffusion-directed local interconnect 445. Because diffusion-directed local interconnect 445 of FIG. 4A does not overlap with diffusion region 400, it increases the cell height for transistors 405 and 420.

The local interconnect structure of FIGS. 4A and 4B has numerous applications besides the biasing of a blocking transistor's gate. For example, consider the diode-connected transistor 500 of FIG. 5C. Like other transistors, diode-connected transistor 500 is formed using a gate layer 505 and an underlying continuous diffusion region 510 as shown in FIG. 5A. In this embodiment, diode-connected transistor 500 is a PMOS transistor but the following concepts are also applicable to NMOS transistors. The drain (D) terminal and source (S) terminal for diode-connected transistor 500 are in the corresponding portions of diffusion region 500 to either side of gate layer 505. A drain or source terminal cannot simply float but instead requires a coupling through a level 1 gate-directed local interconnect, a level 2 gate-directed local interconnect, and a via to the corresponding power or ground interconnect in an overlaying metal layer. For illustration clarity, level 1 local interconnects are not shown in FIGS. 5A and B. A gate-directed local interconnect 515 couples to the source terminal for diode-connected transistor 500 (through a corresponding level 1 gate-directed local interconnect). Analogous to diffusion-directed local interconnect 445 discussed above, a diffusion-directed local interconnect 525 couples between gate-directed local interconnect 515 and gate layer 505 to provide the gate-to-source connection for diode-connected transistor 500. The cell height for diode-connected transistor 500 is thus reduced as compared to prior-art approaches for the same reasons as discussed with regard to transistors 405 and 420 of FIG. 4A. To reduce the cell height even further, a diffusion-directed local interconnect 530 may be used as shown in FIG. 5B that overlaps continuous diffusion region 510 (i.e., the footprint for interconnect 530 is within the footprint for diffusion region 510). Such an overlap shortens the resulting cell height for diode-connected transistor 500 as discussed earlier with regard to transistors 405 and 420 of FIG. 4B.

Figure 6B:
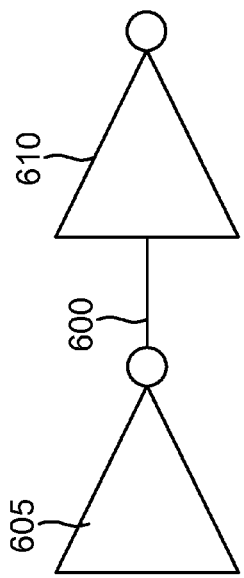
FIG. 6B is a schematic representation of the inverter-to-inverter serial coupling of FIG. 6A.
Figure 6A:
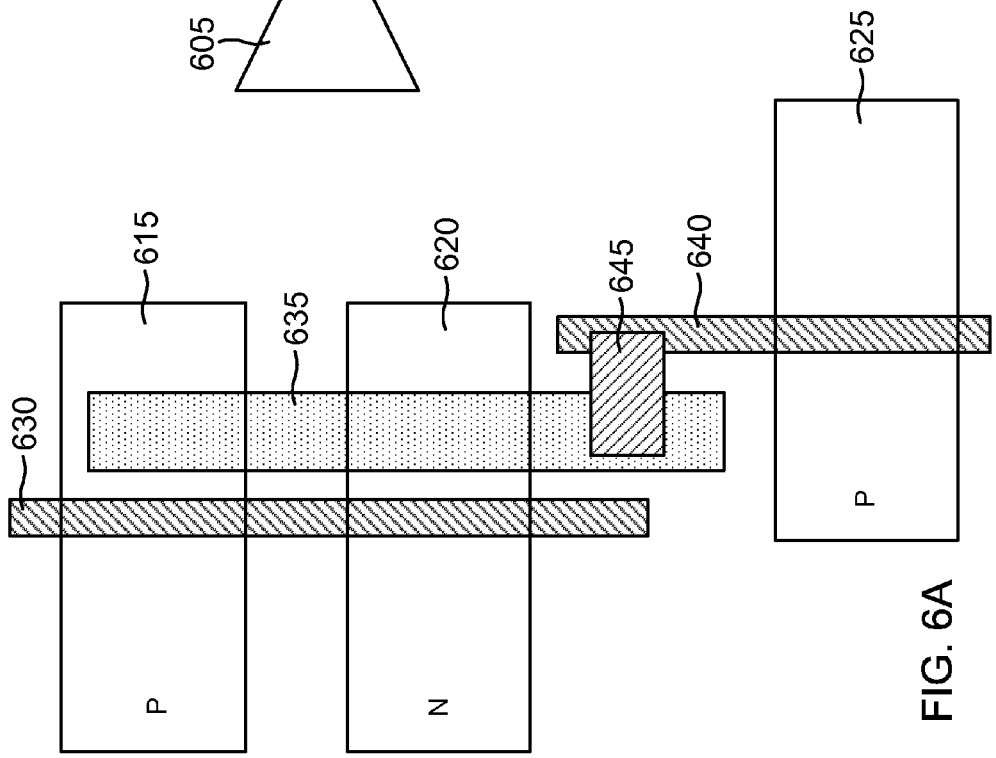
FIG. 6A illustrates a layout for an inverter-to-inverter serial coupling in which a diffusion-directed local interconnect couples between a gate-directed local interconnect for a first inverter to a gate layer for a second inverter.

Yet another application of such a "gate layer coupled through a diffusion-directed local interconnect to a gate-directed interconnect" topology is shown in the layout of FIG. 6A for an inverter-to-inverter serial coupling 600 of FIG. 6B. As known in the circuit arts, each inverter is formed using a serial stack of a PMOS transistor and an NMOS transistor. Inverter 605 is thus formed using a p-type diffusion region 615 and an n-type diffusion region 620. For illustration clarity, only a p-type diffusion region 625 is shown for inverter 610. For inverter 605, a single gate layer 630 forms the gate for its PMOS/NMOS stack of transistors. To form the output of inverter 605, a gate-directed local interconnect 635 couples to the PMOS transistor drain (D) and the NMOS transistor source (S) for inverter 605. As known in the inverter arts, such an output for inverter 605 couples to the gate for the PMOS transistor and NMOS transistor for inverter 610. A gate layer 640 forms this gate for the PMOS and NMOS transistors in inverter 610. A diffusion-directed local interconnect 645 couples gate-directed local interconnect 635 and gate layer 640 to form coupling 600. Note that there is no advantage of relocating diffusion-directed local interconnect 645 to overlap one of the diffusion regions because diffusion region 625 is separated from diffusion region 620 by the diffusion-region pitch implemented by the corresponding foundry. Locating diffusion-directed local interconnect 645 within this pitch-based separation between diffusion region 620 and diffusion region 625 thus does not contribute to the resulting cell height for inverters 605 and 610.

Figure 7B:
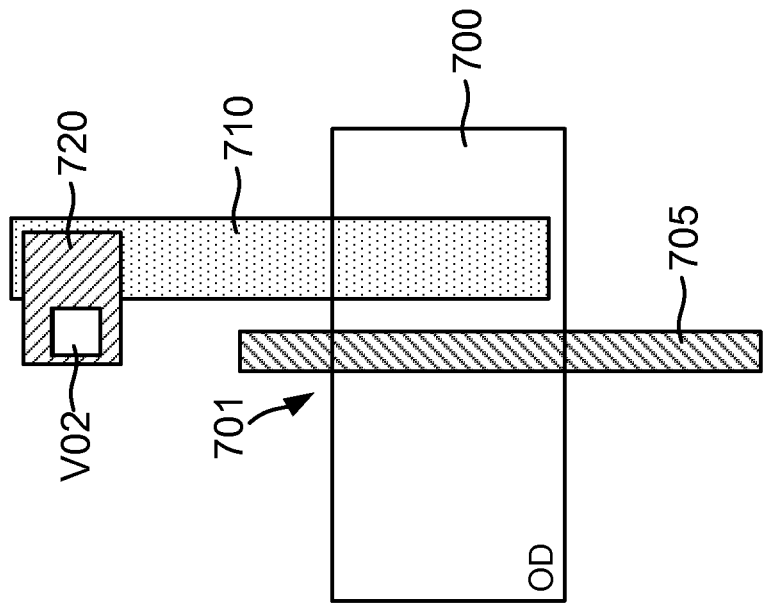
FIG. 7B illustrate a shift of the via placement of FIG. 7B using a diffusion-directed local interconnect.
Figure 7A:
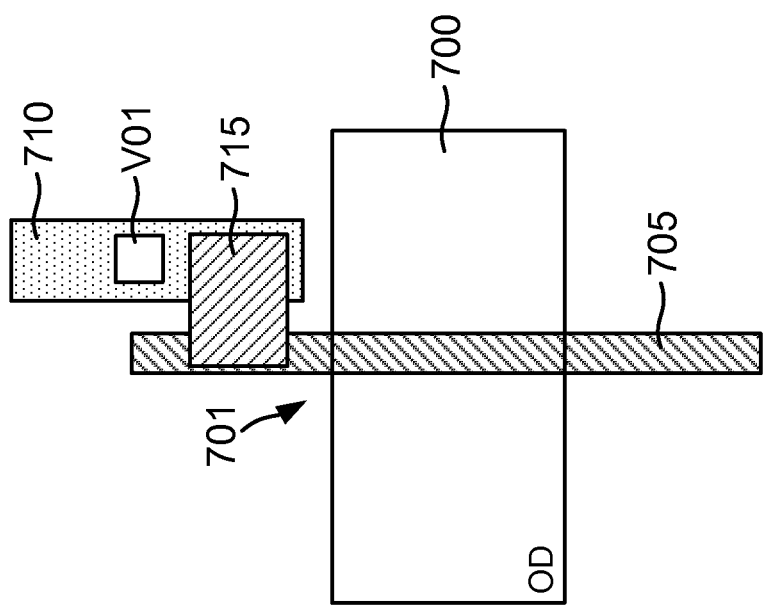
FIG. 7A illustrates a layout for a via placement for a gate-directed local interconnect for a transistor including diffusion-directed local interconnect coupling to its gate.

The local interconnect structure disclosed herein may also be used to shift a via connection site. Referring again to transistor 420 of FIG. 4A, via V0 provides the biasing for the source of transistor 420 as well as the gate of blocking transistor 430. FIG. 7A illustrates the same via coupling site location for a transistor 701 formed by a gate layer 705 and a continuous diffusion region 700. A via V01 couples to a gate-directed local interconnect 710 to bias gate 705 through a diffusion-directed local interconnect 715. If a particular design required a shifting of this via coupling site, a diffusion-directed local interconnect 720 may be used as shown in FIG. 7B. A via V02 couples to diffusion-directed local interconnect 720 to bias gate-directed local interconnect 710. In this fashion, the via coupling site is shifted through an appropriate diffusion-directed local-interconnect-to-gate-directed-local-interconnect layout.

Figure 8:
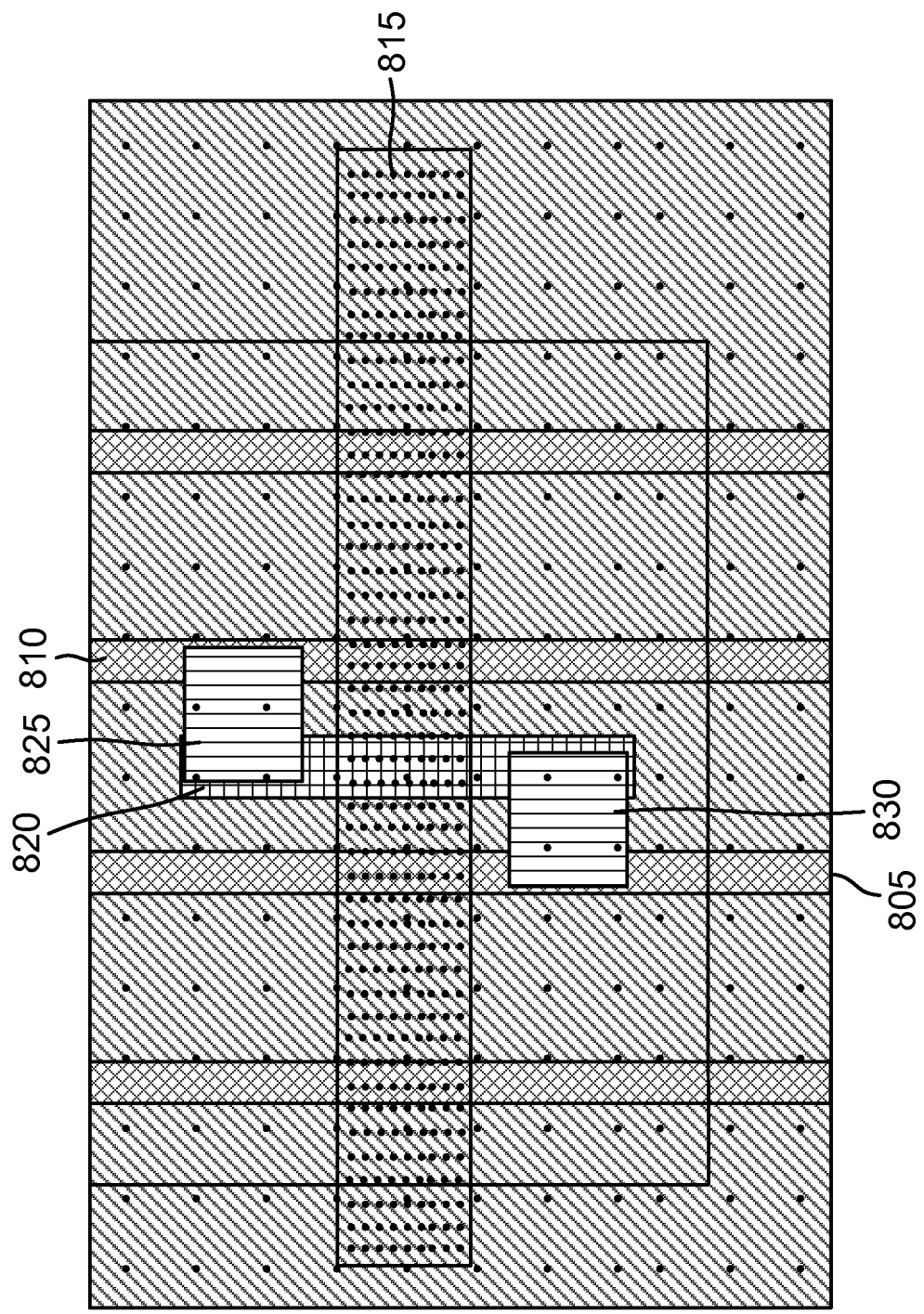
FIG. 8 illustrates a layout for a plurality of gate layers isolated by a gate cut layer, wherein one of the gate layers couples across the gate cut layer to another one of the gate layers through a diffusion-directed and gate-directed arrangement of local interconnects.

Another alternative application of the local interconnect structure disclosed herein is shown in FIG. 8. A plurality of gate layers such as a gate layer 810 are intersected by a gate cut layer 815 to form electrically isolated gate layers. There may then be a need to selectively re-couple some of the resulting isolated gate layers. For example, a diffusion-directed local interconnect 825 may couple gate layer 810 to a gate-directed local interconnect layer 820 that traverses across gate cut layer 815 to couple to another diffusion-directed local interconnect 830. In turn, diffusion-directed local interconnect 830 couples to an otherwise-isolated gate layer 805. In this fashion, gate layers 810 and 805 are coupled together despite the isolation caused by gate cut layer 815.

Example Method of Manufacture

Figure 9:
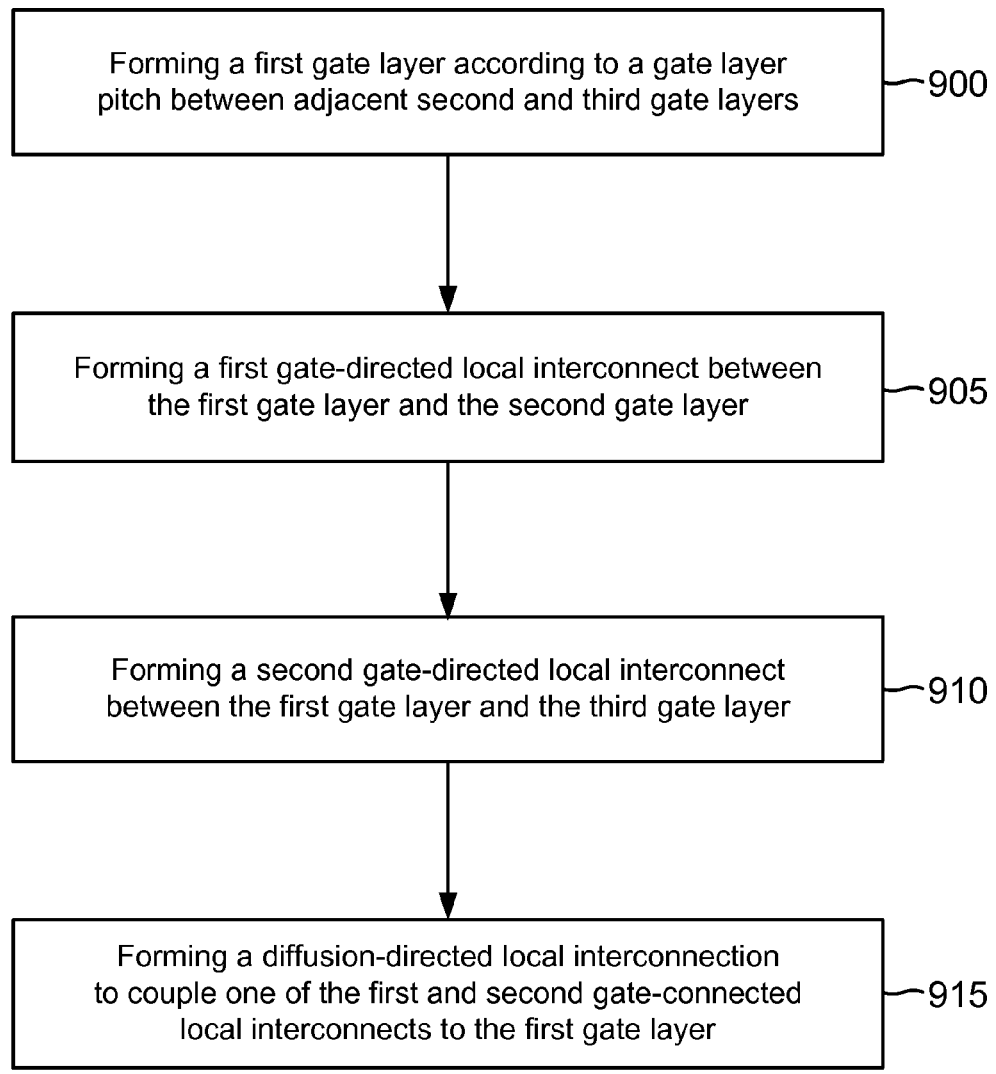
FIG. 9 is a flowchart for forming a diffusion-directed local interconnect coupled between a gate layer and a gate-directed local interconnect.

A flowchart for an example method of manufacture for a local interconnect structure is provided in FIG. 9. In an initial step 900, a first gate layer is formed according to a gate layer pitch between adjacent second and third gate layers. In a step 905, a first gate-directed local interconnect is formed between the first gate layer and the second gate layer. Similarly, in a step 910, a second gate-directed local interconnect is formed between the first gate layer and the third gate layer. Finally, in a step 915, a diffusion-directed local interconnect is formed to couple one of the first and second local gate-directed local interconnects to the first gate layer.

As those of some skill in this art will by now appreciate and depending on the particular application at hand, many modifications, substitutions and variations can be made in and to the materials, apparatus, configurations and methods of use of the devices of the present disclosure without departing from the spirit and scope thereof. In light of this, the scope of the present disclosure should not be limited to that of the particular embodiments illustrated and described herein, as they are merely by way of some examples thereof, but rather, should be fully commensurate with that of the claims appended hereafter and their functional equivalents.

What is claimed is:

1. A circuit comprising:
a first gate layer arranged according to a gate layer pitch between a second gate layer and a third gate layer;
a first gate-directed local interconnect arranged between the first gate layer and the second gate layer;
a second gate-directed local interconnect arranged between the first gate layer and the third gate layer; and
a diffusion-directed local interconnect layer configured to couple the first gate layer to one of the first and second gate-directed local interconnects, wherein the first gate-directed local interconnect, the second gate-directed local interconnect, and the diffusion-directed local interconnect are all located between a lower-most metal layer and a semiconductor substrate for the circuit.

2. The circuit of claim 1, further comprising a continuous diffusion region, wherein the first gate layer comprises a gate for a blocking transistor formed in the continuous diffusion region, and wherein the first gate-directed local interconnect is configured to couple to a first source/drain terminal for an adjacent first transistor and wherein the second gate-directed local interconnect is configured to couple to a second drain/source terminal for an adjacent second transistor.

3. The circuit of claim 2, wherein the diffusion-directed local interconnect layer is positioned outside of a footprint for the continuous diffusion region.

4. The circuit of claim 1, wherein the diffusion-directed local interconnect layer is positioned within a footprint for the continuous diffusion region.

5. The circuit of claim 2, wherein the diffusion-directed local interconnect layer is configured to couple the first gate-directed local interconnect to the first gate layer, the circuit further comprising a via coupled between a first metal layer and the first gate-directed interconnect layer to couple the first gate layer for the second transistor to a power supply node.

6. The circuit of claim 2, wherein the first gate-directed local interconnect, the second gate-directed local interconnect, and the diffusion-directed local interconnect are each level 2 interconnects, the circuit further comprising a first level 1 gate-directed local interconnect arranged between the first level 2 gate-directed local interconnect and the first source/drain terminal to couple the first level 2 gate-directed local interconnect to the first source/drain terminal.

7. The circuit of claim 1, wherein the first gate-directed local interconnect, the second gate-directed local interconnect, and the diffusion-directed local interconnect all comprise tungsten.

8. The circuit of claim 1, wherein the first gate layer is the gate layer for a diode-connected transistor.

9. The circuit of claim 8, further comprising a continuous diffusion region including drain/source terminals for the diode-connected transistor, and wherein the diffusion-directed local interconnect is located outside of a footprint for the continuous diffusion region.

10. The circuit of claim 1, wherein the first gate layer is a gate layer for a first inverter, and wherein the one of the first and second gate-directed local interconnects is a gate-directed local interconnect for an output node for a second inverter.

11. The circuit of claim 1, further comprising:
a fourth gate layer separated from the first gate layer by a gate cut layer, wherein the one of the first and second gate-directed local interconnects is configured to extend across the gate cut layer; and
a second diffusion-directed local interconnect configured to couple the one of the first and second gate-directed local interconnects to the fourth gate layer.

12. A method, comprising:
forming a first gate layer over a semiconductor substrate according to a gate layer pitch between adjacent second and third gate layers;
forming a first gate-directed local interconnect between the first gate layer and the second gate layer;
forming a second gate-directed local interconnect between the first gate layer and the third gate layer; and
forming a diffusion-directed local interconnect to couple one of the first and second gate-connected local interconnects to the first gate layer, wherein the first gate-directed local interconnect, the second gate-directed local interconnect, and the diffusion-directed local interconnect are all located between the semiconductor substrate and an adjacent lower-most metal layer.

13. The method of claim 12, wherein forming the first gate layer forms a gate for a blocking transistor.

14. The method of claim 13, further comprising forming a continuous diffusion region, wherein forming the first gate layer forms a gate for a transistor having a pair of drain/source terminals in the continuous diffusion region, and wherein forming the diffusion-directed local interconnect comprises forming the diffusion-directed local interconnect outside of a footprint for the continuous diffusion region.

15. The method of claim 13, further comprising forming a continuous diffusion region, wherein forming the first gate layer forms a gate for a transistor having a pair of drain/source terminals in the continuous diffusion region, and wherein forming the diffusion-directed local interconnect comprises forming the diffusion-directed local interconnect within a footprint for the continuous diffusion region.

16. The method of claim 12, further comprising forming a via coupled between the one of the first and second gate-directed local interconnects and a first metal layer.

17. A circuit comprising:
a continuous diffusion region within a semiconductor substrate;
a pair of gate layers configured to form gates for a pair of transistors having source/drain terminals in the continuous diffusion region;
a third gate layer arranged between the pair of gate layers to form a gate for a blocking transistor;
a gate-directed local interconnect configured to couple to a drain/source terminal for a transistor in the pair of transistors; and
means for coupling the gate-directed local interconnect to the third gate layer, wherein the gate-directed local interconnect and the means are both located between the semiconductor substrate and an adjacent lower-most metal layer.

18. The circuit of claim 17, wherein the continuous diffusion region is a p-type diffusion region, and wherein the means for coupling the gate-directed local interconnect to the third gate layer is configured to couple the third gate layer to a supply voltage VDD.

19. The circuit of claim 17, wherein the continuous diffusion region is a n-type diffusion region, and wherein the means for coupling the gate-directed local interconnect to the third gate layer is configured to couple the third gate layer to ground.

20. The circuit of claim 17, wherein the means is formed within a footprint for the continuous diffusion region.

* * * * *